United States Patent
Kase et al.

(10) Patent No.: US 7,508,246 B2
(45) Date of Patent: Mar. 24, 2009

(54) PERFORMANCE VARIATION COMPENSATING CIRCUIT AND METHOD

(75) Inventors: Kiyoshi Kase, Austin, TX (US); Dzung T. Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 134 days.

(21) Appl. No.: 11/532,295

(22) Filed: Sep. 15, 2006

(65) Prior Publication Data

US 2008/0068061 A1    Mar. 20, 2008

(51) Int. Cl.
  *H03H 11/26* (2006.01)
  *H03B 1/00* (2006.01)
  *H03K 19/094* (2006.01)

(52) U.S. Cl. .................. 327/261; 327/108; 326/30; 326/86

(58) Field of Classification Search .................. 327/262, 327/108, 512, 513, 161, 158; 326/30, 83, 326/86; 377/25, 44
  See application file for complete search history.

(56) References Cited

U.S. PATENT DOCUMENTS

| | | | |
|---|---|---|---|
| 5,162,672 A | 11/1992 | McMahan et al. | |
| 5,170,073 A | 12/1992 | Hahn et al. | |
| 5,294,845 A | 3/1994 | McMahan et al. | |
| 5,859,541 A * | 1/1999 | McMahan et al. | 326/30 |
| 6,515,503 B2 | 2/2003 | Griffin et al. | |
| 2002/0140482 A1 * | 10/2002 | Wong et al. | 327/262 |
| 2006/0100811 A1 * | 5/2006 | Bhushan et al. | 702/117 |

* cited by examiner

*Primary Examiner*—Quan Tra
*Assistant Examiner*—Colleen O'Toole
(74) *Attorney, Agent, or Firm*—Robert L. King; Joanna G. Chiu

(57) ABSTRACT

A circuit's performance may vary based on various factors such as, for example, process, voltage, and/or temperature. In one embodiment, a circuit includes an input terminal which receives an input signal, a delay selection section which delays the input signal by a delay amount selected by a performance variation indicator, an impedance selection section which outputs the delayed input signal as a compensated delayed signal, where the impedance selection section uses a driver impedance amount selected by the performance variation indicator, and an output terminal which outputs the compensated delayed signal. The circuit may also include a ring oscillator, a frequency counter which provides a count value which indicates a number of rising edges of an output of the ring oscillator which occur during a period of a reference frequency, and a decoder which uses the count value to output the performance variation indicator.

18 Claims, 3 Drawing Sheets

PERFORMANCE VARIATION COMPENSATING CIRCUIT AND METHOD

FIELD OF THE INVENTION

The present invention relates generally to semiconductors, and more particularly to circuits that compensate from effects of processing and operational variations.

BACKGROUND OF THE INVENTION

Semiconductor circuits, regardless of the process used in manufacturing, exhibit a variation in their operating characteristics as a result of process, voltage and temperature (PVT) variations. For example, within a same manufacturing process all of the transistors are not manufactured with precisely the same physical characteristics. Any variation results in a difference in the operating performance of the circuit. Additionally, the temperature that exists at each junction of n-type and p-type material directly affects the performance of the device associated with that junction. After an integrated circuit die is encapsulated or otherwise packaged, the junction temperatures across the integrated circuit die may vary. This variation results in inconsistent circuit behavior. Additionally, as the ambient temperature varies, so does the circuit performance. A third well-known variation that affects semiconductor performance is the variation of a power supply voltage. Generally, transistors operate at a faster speed when a higher power supply voltage is used. However, during operation the power supply voltage may fluctuate from influences such as interference and noise. Other reasons for a variation in the power supply voltage include the switching of numerous transistors at a same time and a varying portable power source, such as a battery.

These variations create a number of serious operational issues. Due to varied operating conditions, the propagation delay and the output impedance of drivers vary widely. Propagation delay is the amount of time it takes for a transistor to switch state once a control signal is applied to make the transistor switch. As a result it is difficult to accurately match impedance from the output of one stage to the input of a successive stage. The lack of accurately matched impedances results in power loss from one stage to another and thus inefficient operation. Variation of the propagation delay seriously impacts the system timing in an integrated circuit, especially at high frequency. Without a constant delay across all operating conditions, system timing is unreliable. To compensate for the propagation delay variation, a timing margin must be built into the system design and that additional margin degrades the integrated circuit's performance.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
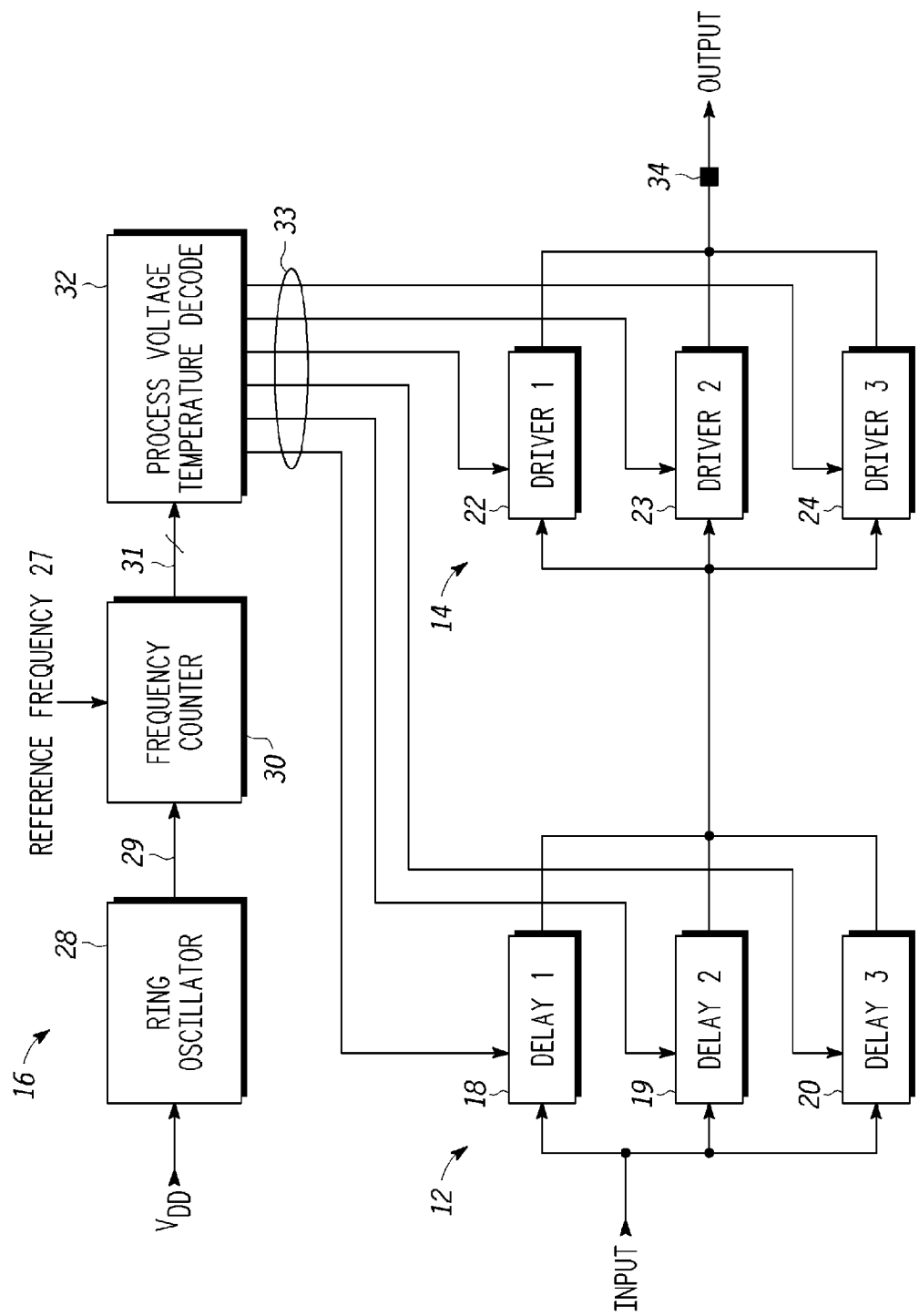
FIG. 1 illustrates in block diagram form a compensated circuit in accordance with one form of the present invention.

FIG. 1 illustrates a circuit 10 generally having a delay section 12, an impedance selection section 14 and a PVT (process, voltage and temperature) decode section 16. In delay section 12, an input terminal is provided for receiving an input signal labeled "INPUT". The input terminal is connected to a first input of each of a first delay element 18, a second delay element 19 and a third delay element 20. The first delay element 18, the second delay element 19 and the third delay element 20 each have a control input for receiving a respective different bit of a PVT control signal 33. Each of the first delay element 18, the second delay element 19 and the third delay element 20 has an output connected together and to an input terminal of the impedance selection section 14. In one form the delay elements described herein are implemented as a plurality of series-connected inverters. It should be apparent that other delay circuits could be used. For example, each delay element may be implemented as a resistor of differing value or other type of resistive device. Each of the delay elements may be implemented with a same amount of delay or with differing amounts of delay. In one form the first delay element 18 is implemented with less total delay than the second delay element 19, and the second delay element 19 is implemented with less delay than the third delay element 20. The impedance selection section 14 has a first driver 22, a second driver 23 and a third driver 24. Each of the first driver 22, the second driver 23 and the third driver 24 has an input connected together and to the connected outputs of the first delay element 18, the second delay element 19 and the third delay element 20. Each of the first driver 22, the second driver 23 and the third driver 24 has a control terminal for receiving a respective different bit of PVT control signal 33. Each of the first driver 22, the second driver 23 and the third driver 24 also has an output connected together and to an output pad 34 for providing an output signal labeled "OUTPUT". The PVT decode section 16 has a ring oscillator 28 having a power terminal connected to a power supply voltage labeled "$V_{DD}$". An output of the ring oscillator 28 provides an oscillator frequency signal 29 and is connected to an input of a frequency counter 30. A reference input of the frequency counter 30 is connected to a reference frequency signal 27. An output of the frequency counter 30 provides a signal 31 and is connected to an input of a process voltage temperature (PVT) decode circuit 32 that functions as a PVT decoder. Outputs of the process voltage temperature decode circuit 32 provide the PVT control signal 33. In one form each of the driver circuits 22-24 is implemented as schematically identical driver circuits having the same individual impedance and drive capability. However, it should be apparent that the driver circuits may be implemented with differing drive impedances and drive strengths or as different schematic drivers. It should be appreciated that typically a larger number of parallel connected delay elements may be provided as well as a larger number of parallel-connected driver circuits to provide more options on the amount of delay, output impedance and drive strength. However, for convenience of illustration a smaller number of delay elements and drivers are provided.

In operation, assume that the process voltage temperature decoder 32 is reset so that the PVT control signal 33 is initialized to a default value. With the default value the circuit 10 typically operates by making a single default delay circuit operative and a single default driver circuit operative. For purposes of illustration, assume that the default value of the PVT control signal 33 selects the first delay element 18 and the first driver circuit 22. Second delay element 19, third delay element 20, driver 23 and driver 24 are otherwise selected as different amounts of delay and impedance are needed.

Assume that when the PVT is at a typical condition (i.e. an anticipated operating condition), the second delay element 19 is selected by the process voltage temperature decode circuit 32 and the first driver circuit 22 and third driver circuit 24 are selected. A typical condition is specified by a desired voltage value for the power supply voltage, $V_{DD}$, and the pn junction operating temperature is at a predetermined desired temperature. These values are implementation specific and may vary significantly from application to application. As an example, a desired $V_{DD}$ value may be 1.8 volts and the junction temperature may be twenty-five degrees Celsius. Assume also that the process has resulted in a transistor drive current that is anticipated as a typical value for the process. If the PVT signal 33 changes in response to circuit conditions and selects a different delay such as the first delay element 18, the second delay element 19 is unchosen. Now assume that a junction temperature increase occurs and the junction temperature becomes one hundred five degrees Celsius. Additionally, assume that the $V_{DD}$ value drops to 1.65 volts. Further assume that the process characteristic results in low transistor drive current. The changed operating parameters results in a noticeable signal delay between the input to the delay elements and the outputs of the driver circuits. The changed parameters also cause an increase in the impedance of the parallel driver circuits 22 and 24. Thus the amount of delay that is provided by the delay elements needs to be reduced by the process voltage temperature decode circuit 32 as described below. As a result, the second delay element 19 is removed from the signal path by the appropriate control bit from PVT control signal 33. The PVT control signal 33 thus functions as a performance variation indicator. Assuming that the first delay element 18 is implemented with a smaller delay than delay element 19, the smaller first delay element 18 again becomes active. At the same time the process voltage temperature decode 32 functions to lower the increased impedance of the driver circuits. This goal is accomplished by asserting the appropriate control bit of PVT control signal 33 to place the second driver circuit 23 into the signal path. As a result, each of driver circuits 22, 23 and 24 is connected in parallel which causes a reduction in the amount of impedance in the driver selection section 14. Again, it should be readily apparent that any number of driver circuits may be implemented and that the more driver circuits that are implemented the more the amount of granularity in impedance values may be provided.

In another form assume that the power supply voltage has increased from 1.8 volts to approximately 1.95 volts. Also assume that the junction temperature drops to minus twenty Celsius. Additionally, assume the best possible processing parameters in which the drive current of the transistors is the highest achievable. Under these operating conditions the signal path speed of circuit 10 is increased or made faster than the specified PVT condition. Therefore, additional delay is required to be added to delay section 12. Additionally, more impedance is desired in the impedance selection section 14. To implement these desired conditions, the second delay element 19 is opened and removed from the signal path and the third delay element 20 is activated and inserted into the signal path. Within the impedance selection section 14 the first driver 22 is removed from the signal path so that only the third driver 24 is in the signal path. Therefore, the impedance of the impedance selection section 14 is increased by using only one driver in the signal path.

It should be understood that there may be processing and operating variations which result in an increase in the signal delay time and a decrease in the drive impedance. Alternatively, it may be desired to decrease the signal delay time and increase the drive impedance.

Figure 2:
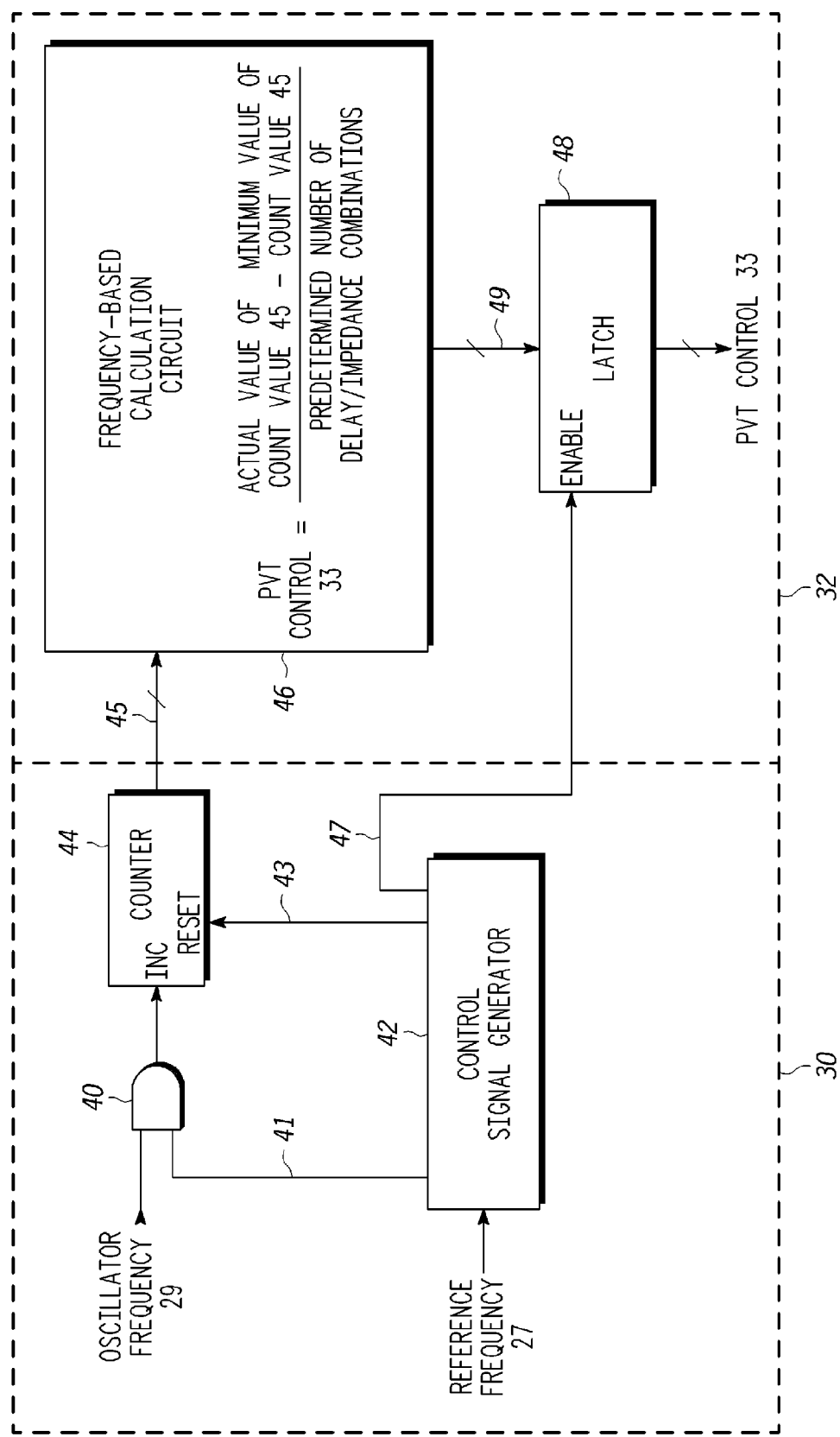
FIG. 2 illustrates in block diagram form an implementation of frequency counting and PVT decoding in accordance with the present invention.

Illustrated in FIG. 2 is a block diagram of a portion of the frequency counter 30 and a portion of the process voltage temperature decode circuit 32. Within the frequency counter 30 an AND gate 40 has a first input for receiving an oscillator frequency signal 29 which is the output of ring oscillator 28 of FIG. 1. A second input of AND gate 40 is connected to a signal 41 that is provided from an output of a control signal generator 42. An input of the control signal generator 42 receives the reference frequency signal 27 of FIG. 1. Another output of the control signal generator 42 is connected to a reset input of a counter 44. An increment (INC) input of counter 44 is connected to an output of AND gate 40. An output of counter 44 is connected to an input of a frequency-based calculation circuit 46 and provides a count value 45. An output of the frequency-based calculation circuit 46 provides a calculation output signal 49 and is connected to an input of a latch 48. An output of the control signal generator 42 provides a signal 47 and is connected to an enable input of the latch 48. The latch 48 provides the PVT control signal 33 of FIG. 1.

Figure 3:
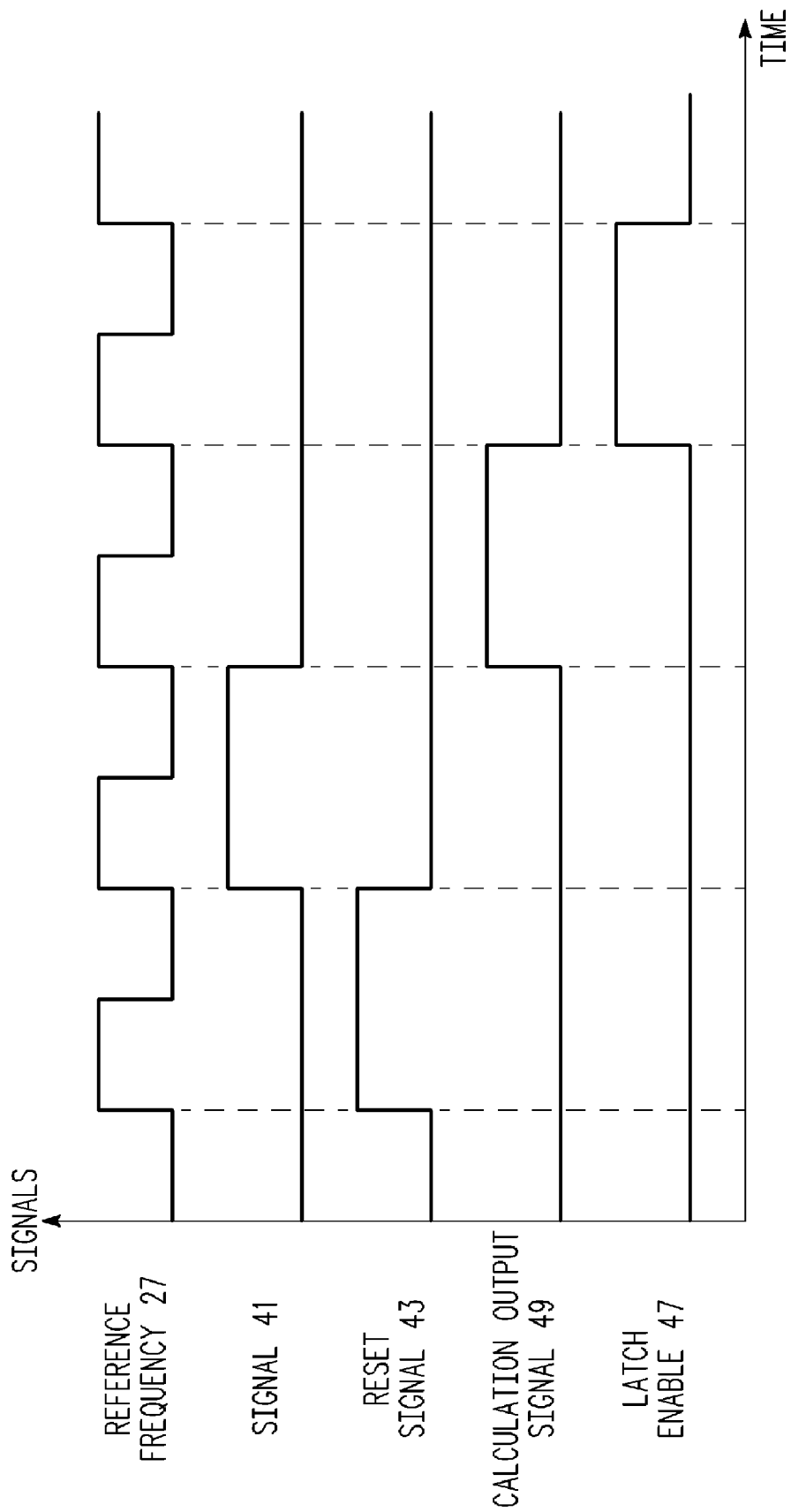
FIG. 3 illustrates in timing chart form an exemplary operating condition of the circuits of FIG. 1 and FIG. 2.

In the illustrated form the frequency-based calculation circuit 46 provides the PVT control signal 33 based upon a frequency. The ring oscillator 28 is a conventional oscillator that receives the power supply voltage and generates the oscillator frequency signal 29. In one form the ring oscillator 28 is implemented with the same types of transistors (i.e. made with the same process) as is used in the driver circuits 22-24. Therefore, the variation in performance within drivers 22-24 will substantially track the variation in frequency supplied by the ring oscillator 28. As a result of this symmetry, the compensation provided by the process voltage temperature decode 32 is in the correct direction that is needed. Reference to the timing diagram of FIG. 3 will facilitate an understanding of the operation of the frequency counter 28 and the process voltage temperature decode 32. Assume that a reset signal 43 is initially applied to the reset input of counter 44. After the counter 44 is reset, the reset signal 43 is de-asserted and the signal 41 is asserted to the second input of AND gate 40. The control signal generator 42 receives the reference frequency signal 27 that is illustrated in FIG. 3. The oscillator frequency signal 29 provided by ring oscillator 28 will vary with processing and operating conditions. The oscillator frequency signal 29 is typically significantly higher in frequency than the reference frequency signal 27. As a result, when the second input to AND gate 40 is asserted in response to a high pulse of the reference frequency signal 27, the counter 44 will be incremented a number of times as a function of the oscillator frequency signal 29. After a cycle of the reference frequency signal 27, the signal 41 is no longer asserted. During the cycle of the reference frequency signal 27 a count value is created that is a function of the actual frequency of the oscillator frequency signal 29. As soon as the count value is available to the frequency-based calculation circuit 46, a calculation is performed to determine a value for the calculation output signal 49 which is the PVT control signal 33. The calculation is a subtraction of the minimum count value that the counter 44 may have. This minimum count value is proportional to the frequency of ring oscillator 28. This minimum count value may be an assumed count value based upon the anticipated range of count values over processing and operating conditions. Alternatively, this minimum count value may be actually measured after the integrated circuit is manufactured and a minimum count value determined. Alternatively, this minimum count value may be a simulated value from commercially available simulation software which simulates the performance and operation of the integrated circuit. Regardless of the various ways that the minimum count of the counter 44 is determined, the minimum count value is subtracted from the actual count value 45 provided by counter 44. This difference is then divided by the existing or previously determined number of delay elements and impedance driver combinations that are in the signal path. For an initial operation this number of delay elements and impedance driver combinations is a predetermined number based upon expected normal circuit operation. The resulting calculation value is a multiple-bit calculation output signal 49 that represents which delay elements and driver circuits should be selected and placed into the signal path based upon the current operating characteristics. In the illustrated form the calculation output signal 49 is implemented as a six-bit signal. It should be understood that any number of bit implementations may be utilized depending upon the application. Calculation output signal 49 is latched into the latch 48 upon assertion of an enable signal 47 by the control signal generator 42 as illustrated in FIG. 3.

It should be noted that PVT control signal 33 functions as a performance variation indicator. It should be noted that at least one delay circuit is functional continuously as a default delay to permit the input signal to pass through delay section 12. Similarly at least one driver circuit in impedance selection section 14 is functional continuously as a default driver to permit the input signal to pass through impedance selection section 14. In one form the selection of one or more delay elements in delay section 12 may automatically select at least one predetermined driver circuit in the impedance selection section 14. To improve the circuit's flexibility of delay amounts, the amount of delay that is implemented by each delay element is typically a different amount of delay. In the discussion above only one delay element is enabled at any point in time so that the input signal is coupled to the impedance selection section 14 via a single delay element. However, it should be understood that any number of delay elements may be enabled at the same time. In one form, the selection of a delay element and one or more driver circuit(s) may be implemented by connecting each delay element only to one driver circuit and thus the selection of a delay element automatically selects the driver circuit. The reverse may also be true where a driver circuit selection automatically selects a delay amount.

By now it should be appreciated that there has been provided a circuit and method to control output impedance and the propagation delay of a high speed circuit. In one form the high speed circuit may be used as a transmitter for the use of preparing data at an output terminal for transmission. Various other uses of the circuit exist. Counter 44 functions as a digital frequency counter to detect frequency variation caused by processing variations and changing circuit operating conditions. Accurate compensation for propagation delays and varying output impedances is provided by using a fully digital PVT controller. The circuit and method provided herein controls propagation delay over a wide process window and a constant output impedance is maintained. As a result low noise operation is provided even when noise and interference exists.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. It should be understood that all circuitry described herein may be implemented either in silicon or another semiconductor material or alternatively by software code representation of silicon or another semiconductor material.

In one form there is herein provided a circuit having an input terminal which receives an input signal. A delay selection section delays the input signal by a delay amount selected by a performance variation indicator. An impedance selection section is coupled to the delay selection section and outputs the delayed input signal as a compensated delayed signal. The impedance selection section uses a driver impedance amount selected by the performance variation indicator. An output terminal coupled to the impedance selection section outputs the compensated delayed signal.

In another form when the performance variation indicator has a first value a first delay amount is indicated and a first driver impedance amount is indicated. When the performance variation indicator has a second value a second delay amount is indicated and a second driver impedance is indicated. At least one of the first delay amount and first driver impedance amount is different from the second delay amount and the second driver impedance, respectively.

In another form the performance variation indicator indicates a variation in at least one characteristic selected from a group consisting of process, voltage, and temperature. In another form there is provided a PVT decode section coupled to the delay selection section and impedance selection section which outputs the performance variation indicator.

In one form the PVT decode section further includes a ring oscillator and a frequency counter coupled to the ring oscillator. The frequency counter provides a count value which indicates a number of rising edges of an output of the ring oscillator which occur during a period of a reference frequency. A PVT decoder uses the count value to output the performance variation indicator. In another form the delay selection section has a plurality of delay paths, wherein each delay path of the plurality of delay paths is enabled or not enabled in response to the performance variation indicator to provide the selected delay amount. In another form only one of the plurality of delay paths is enabled in response to the performance variation indicator. In yet another form the impedance selection section has a plurality of driver circuits coupled in parallel, wherein each of the driver circuits is selectively enabled in response to the performance variation indicator to provide the selected driver impedance amount.

In yet another form there is provided a method wherein a performance variation indicator is provided. An input signal is received. The input signal is delayed by a delay amount in response to the performance variation indicator to provide a delayed signal. A driver impedance of one or more drivers used to drive the delayed signal to an output terminal is modified, said modifying determined in response to the performance variation signal to provide a compensated delayed signal. In yet another form the performance variation indicator represents a variation in at least one characteristic selected from a group consisting of process, voltage, and temperature. In another form delaying the input signal includes using the performance variation indicator to select one of a plurality of delay paths for delaying the input signal. In yet another form the delaying signal is compensated by using the performance variation signal to select at least one of a plurality of driver circuits to provide the compensated delayed signal, wherein the plurality of driver circuits are coupled in parallel. In yet another form the performance variation indicator is provided by receiving a ring oscillator frequency signal. A reference frequency signal is received. A count value which indicates at least a number of rising or falling (or both) edges of the ring oscillator frequency signal which occur during a period of a reference frequency signal is provided. The count value is used to provide the performance variation indicator. In another form the performance variation indicator represents PVT variations.

In yet another form there is provided a circuit having a ring oscillator which provides a ring oscillator frequency signal. A frequency counter is coupled to the ring oscillator. The frequency counter provides a count value which indicates a number of rising edges of the ring oscillator frequency signal which occur during a period of a reference frequency signal. A PVT decoder, coupled to the frequency counter, uses the count value to output a PVT control signal which represents PVT variations. An input terminal receives an input signal. A delay selection section delays the input signal by a delay amount selected by the PVT control signal. An impedance selection section outputs the delayed input signal as a compensated delayed signal. The impedance selection section uses a driver impedance amount selected by the PVT control signal. In another form there is provided an AND gate, wherein the AND gate receives the ring oscillator frequency signal as a first input and a signal derived from the reference frequency signal as a second input, and provides an output to an increment input of the frequency counter. In another form the PVT decoder further includes a frequency-based calculation circuit which provides a calculation value using the count value. A latch latches the calculation value to provide the PVT control signal. In yet another form a control signal generator receives the reference frequency signal. In response to the reference frequency signal, the control signal generator provides the signal to the second input of the AND gate, provides a reset signal to the frequency counter and provides an enable signal to the latch. In yet another form the delay selection section includes a plurality of delay paths, wherein each delay path of the plurality of delay paths is selectively enabled in response to the PVT control signal to provide the selected delay amount. In yet another form the impedance selection section includes a plurality of driver circuits coupled in parallel, wherein each of the driver circuits is selectively enabled in response to the PVT control signal to provide the selected driver impedance amount.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A circuit comprising:
   a ring oscillator;
   a frequency counter coupled to the ring oscillator, the frequency counter providing a count value which indicates a number of edges of predetermined direction of an output of the ring oscillator which occur during a period of a reference frequency;
   a decoder coupled to the frequency counter and which uses the count value to output a performance variation indicator, the performance variation indicator indicating a variation in at least one characteristic selected from a group consisting of process, voltage, and temperature, the decoder determining a difference between an actual count value and a minimum count value of the counter and dividing the difference by a total number of delay elements and driver circuits presently selected by the performance variation indicator;
   an input terminal which receives an input signal;
   a delay selection section coupled to the input terminal and which delays the input signal by a delay amount selected by the performance variation indicator to provide a delayed input signal;
   an impedance selection section coupled to the delay selection section and which outputs the delayed input signal as a compensated delayed signal, the impedance selection section using a driver impedance amount selected by the performance variation indicator; and
   an output terminal coupled to the impedance selection section and which outputs the compensated delayed signal.

2. The circuit of claim 1, wherein when the performance variation indicator has a first value a first delay amount is indicated and a first driver impedance amount is indicated, and when the performance variation indicator has as a second value a second delay amount is indicated and a second driver impedance is indicated, wherein at least one of the first delay amount and first driver impedance amount is different from the second delay amount and the second driver impedance, respectively.

3. The circuit of claim 1, wherein the decoder further comprises a circuit for subtracting two values and for dividing, wherein the minimum count value is proportional to a frequency of the ring oscillator.

4. The circuit of claim 3, wherein the delay selection section further comprises a plurality of delay elements coupled in parallel and the impedance selection section further comprises a plurality of driver circuits coupled in parallel.

5. The circuit of claim 1, wherein the delay selection section comprises a plurality of delay paths, wherein each delay path of the plurality of delay paths is enabled or not enabled in response to the performance variation indicator to provide the delay amount selected.

6. The circuit of claim 5, wherein only one of the plurality of delay paths is enabled in response to the performance variation indicator.

7. The circuit of claim 1, wherein the impedance selection section comprises a plurality of driver circuits coupled in parallel, wherein each of the driver circuits is enabled or not enabled in response to the performance variation indicator to provide the driver impedance amount selected.

8. A method comprising:
   receiving a ring oscillator frequency signal;
   receiving a reference frequency signal;

providing a count value which indicates at least a number of rising or falling pulse edges of the ring oscillator frequency signal which occur during a period of a reference frequency signal;

using the count value to provide a performance variation indicator, the performance variation indicator indicating a variation in at least one characteristic selected from a group consisting of process, voltage, and temperature, wherein the performance variation indicator is provided by determining a difference between the count value and a minimum count value and dividing the difference by a total number of both delay elements used to provide a delay amount and driver circuits providing the driver impedance presently selected by the performance variation indicator;

receiving an input signal;

delaying the input signal by the delay amount in response to the performance variation indicator to provide a delayed signal; and modifying a driver impedance used to drive the delayed signal to an output terminal, said modifying determined in response to the performance variation indicator to provide a compensated delayed signal.

9. The method of claim 8, wherein the performance variation indicator represents a variation in at least one characteristic selected from a group consisting of process, voltage, and temperature.

10. The method of claim 8, wherein the delaying the input signal comprises:

using the performance variation indicator to select one of a plurality of delay paths for delaying the input signal.

11. The method of claim 8, wherein the modifying the driver impedance further comprises:

using the performance variation indicator to select at least one of a plurality of driver circuits to provide the compensated delayed signal, wherein the plurality of driver circuits are coupled in parallel.

12. The method of claim 8, wherein the minimum count value is either a measured count value, an assumed count value or a simulated count value.

13. A circuit comprising:

a ring oscillator which provides a ring oscillator frequency signal;

a frequency counter coupled to the ring oscillator, the frequency counter provides a count value which indicates a number of rising edges of the ring oscillator frequency signal which occur during a period of a reference frequency signal;

an AND gate for receiving the ring oscillator frequency signal as a first input and a signal derived from the reference frequency signal as a second input, and providing an output to an increment input of the frequency counter;

a PVT decoder, coupled to the frequency counter, which uses the count value to output a PVT control signal which represents PVT variations;

an input terminal which receives an input signal;

a delay selection section which delays the input signal by a delay amount selected by the PVT control signal to provide a delayed input signal; and an impedance selection section which outputs the delayed input signal as a compensated delayed signal, the impedance selection section using a driver impedance amount selected by the PVT control signal.

14. The circuit of claim 13, wherein the delay selection section further comprises a plurality of delay elements coupled in parallel between a first node and a second node, each of the plurality of delay elements implementing a different amount of delay.

15. The circuit of claim 13, wherein the PVT decoder further comprises:

a frequency-based calculation circuit which provides a calculation value using the count value; and a latch which latches the calculation value to provide the PVT control signal.

16. The circuit of claim 13, further comprising:

a control signal generator which receives the reference frequency signal, and in response to the reference frequency signal, provides the signal to the second input of the AND gate, provides a reset signal to the frequency counter and provides an enable signal to the latch.

17. The circuit of claim 13, wherein the delay selection section comprises a plurality of delay paths, wherein each delay path of the plurality of delay paths is enabled or not enabled in response to the PVT control signal to provide the delay amount selected.

18. The circuit of claim 13, wherein the impedance selection section comprises a plurality of driver circuits coupled in parallel, wherein each of the driver circuits is enabled or not enabled in response to the PVT control signal to provide the driver impedance amount selected.

* * * * *